(12) United States Patent
Gan et al.

(10) Patent No.: US 12,068,213 B2
(45) Date of Patent: Aug. 20, 2024

(54) CHIP PACKAGE AND SEMICONDUCTOR ARRANGEMENT HAVING THERMALLY CONDUCTIVE MATERIAL IN CONTACT WITH A SEMICONDUCTOR CHIP AND METHODS OF FORMING THEREOF

(71) Applicant: Infineon Technologies AG, Neubiberg (DE)

(72) Inventors: Thai Kee Gan, Melaka (MY); Sanjay Kumar Murugan, Melaka (MY); Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 271 days.

(21) Appl. No.: 17/531,867

(22) Filed: Nov. 22, 2021

(65) Prior Publication Data
US 2022/0173006 A1 Jun. 2, 2022

(30) Foreign Application Priority Data

Dec. 1, 2020 (DE) ........................ 102020131849.9

(51) Int. Cl.
*H01L 23/31* (2006.01)
*H01L 21/56* (2006.01)
(Continued)

(52) U.S. Cl.
CPC ........ *H01L 23/3135* (2013.01); *H01L 21/561* (2013.01); *H01L 21/565* (2013.01); *H01L 23/296* (2013.01); *H01L 23/3121* (2013.01); *H01L 23/373* (2013.01); *H01L 23/4951* (2013.01); *H01L 23/49524* (2013.01);
(Continued)

(58) Field of Classification Search
CPC ..... H01L 21/561; H01L 21/565; H01L 24/37; H01L 24/84; H01L 24/83; H01L 23/3135; H01L 23/3121; H01L 23/296; H01L 2924/181; H01L 24/40; H01L 23/49524;
(Continued)

(56) References Cited

U.S. PATENT DOCUMENTS 6,146,921 A 11/2000 Barrow
7,692,276 B2 * 4/2010 Lee ...................... H01L 21/565
257/676

(Continued)

FOREIGN PATENT DOCUMENTS

DE 102008027703 A1 1/2009
DE 102014118080 A1 6/2016
DE 102015108700 A1 12/2016

*Primary Examiner* — Alonzo Chambliss
(74) *Attorney, Agent, or Firm* — Murphy, Bilak & Homiller, PLLC

(57) ABSTRACT

A chip package including a semiconductor chip is provided. The chip package may include a packaging material at least partially around the semiconductor chip with an opening extending from a top surface of the packaging material to the semiconductor chip and/or to an electrical contact structure contacting the semiconductor chip, and a thermally conductive material in the opening, wherein the thermally conductive material is configured to transfer heat from the semiconductor chip to an outside, wherein the thermally conductive material extends laterally at least partially over the top surface of the packaging material.

18 Claims, 15 Drawing Sheets

(51) Int. Cl.
*H01L 23/00* (2006.01)
*H01L 23/29* (2006.01)
*H01L 23/373* (2006.01)
*H01L 23/495* (2006.01)

(52) U.S. Cl.
CPC ........ *H01L 23/49575* (2013.01); *H01L 24/37* (2013.01); *H01L 24/40* (2013.01); *H01L 24/84* (2013.01); *H01L 2224/3702* (2013.01)

(58) Field of Classification Search
CPC ........... H01L 23/49575; H01L 23/4951; H01L 23/373
See application file for complete search history.

(56) References Cited

U.S. PATENT DOCUMENTS

| | | | | |
|---|---|---|---|---|
| 9,123,687 | B2 * | 9/2015 | Ewe | ................. H01L 23/49833 |
| 9,331,060 | B2 * | 5/2016 | Otremba | ................. H01L 25/50 |
| 10,283,400 | B1 | 5/2019 | Kelly et al. | |
| 2004/0169289 | A1 | 9/2004 | Satou et al. | |
| 2004/0232545 | A1 | 11/2004 | Takaishi | |
| 2008/0185712 | A1 | 8/2008 | Kanayama et al. | |
| 2009/0230535 | A1 * | 9/2009 | Otremba | ................. H01L 24/25 257/E23.142 |
| 2009/0236749 | A1 * | 9/2009 | Otremba | ................. H01L 24/25 257/774 |
| 2010/0019381 | A1 * | 1/2010 | Haeberlen | ......... H01L 23/49541 257/737 |
| 2013/0200502 | A1 * | 8/2013 | Nikitin | .................... H01L 24/92 257/E23.117 |
| 2013/0328213 | A1 * | 12/2013 | Otremba | ............. H01L 23/5389 257/773 |
| 2014/0213018 | A1 * | 7/2014 | Higgins, III | ........ H01L 23/3121 438/118 |
| 2014/0299980 | A1 | 10/2014 | Choi et al. | |
| 2015/0001701 | A1 * | 1/2015 | Li | ............................ H05K 5/03 257/713 |
| 2015/0090042 | A1 * | 4/2015 | Vaupel | .................. B81B 7/0048 73/725 |
| 2015/0108628 | A1 | 4/2015 | Yu et al. | |
| 2015/0340303 | A1 | 11/2015 | Oh et al. | |
| 2018/0350755 | A1 | 12/2018 | Huang et al. | |
| 2018/0374776 | A1 * | 12/2018 | Liu | ..................... H01L 23/3737 |
| 2020/0058571 | A1 | 2/2020 | Wang et al. | |

* cited by examiner

FIG. 3G
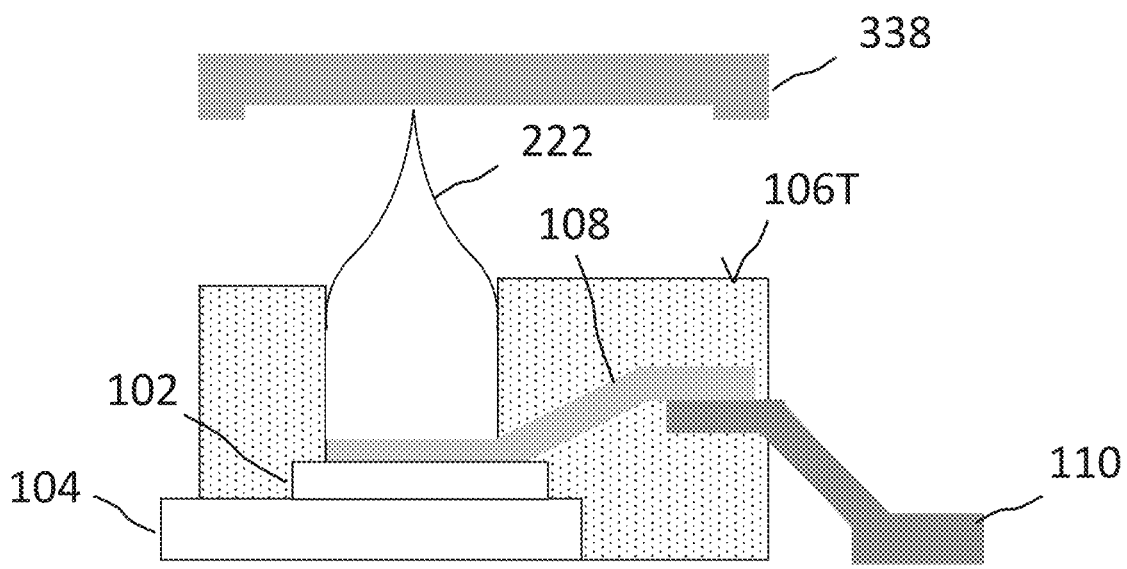
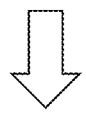
FIG. 3H
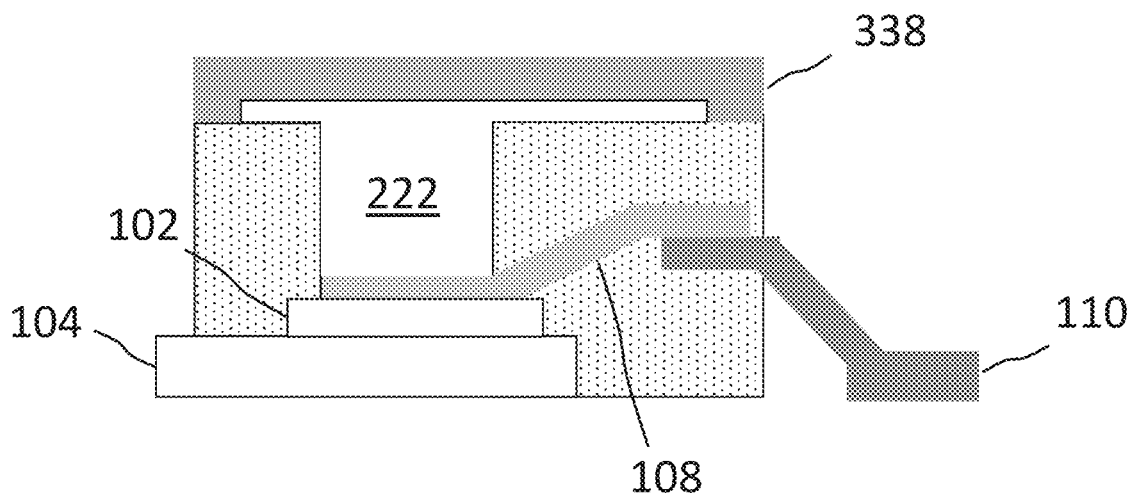

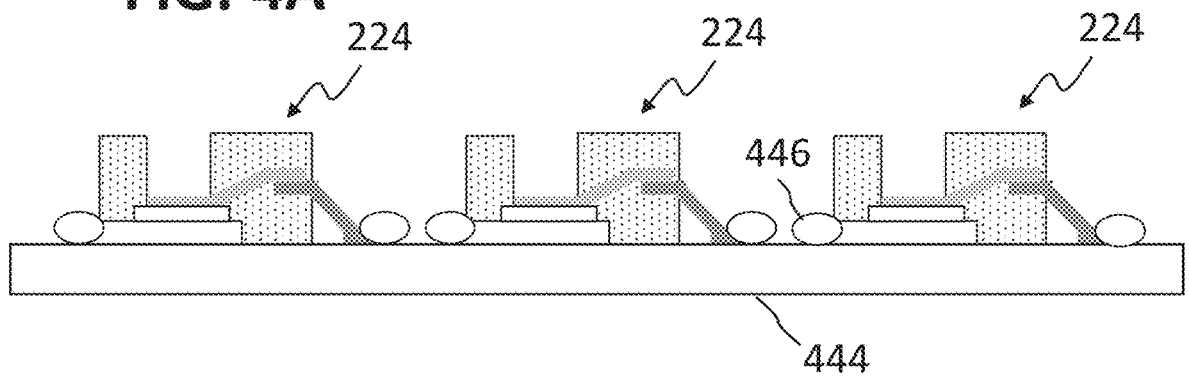
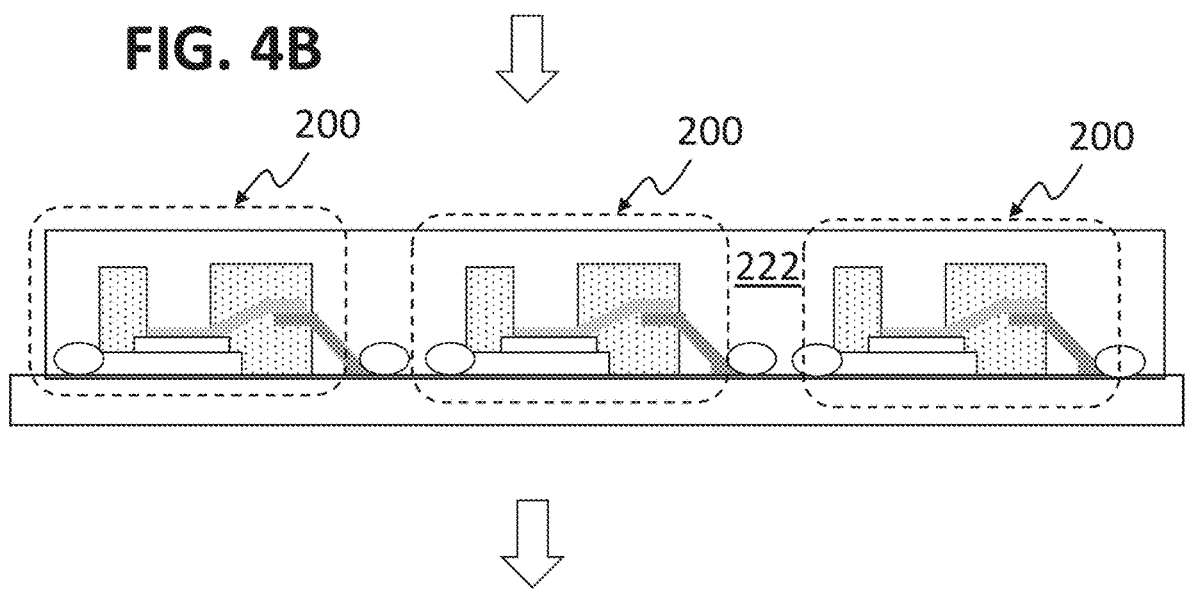
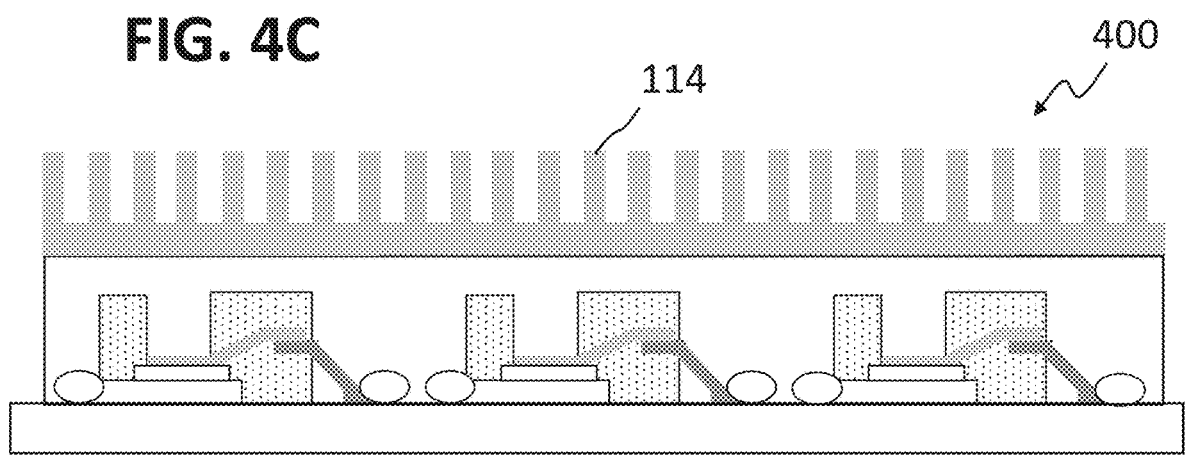

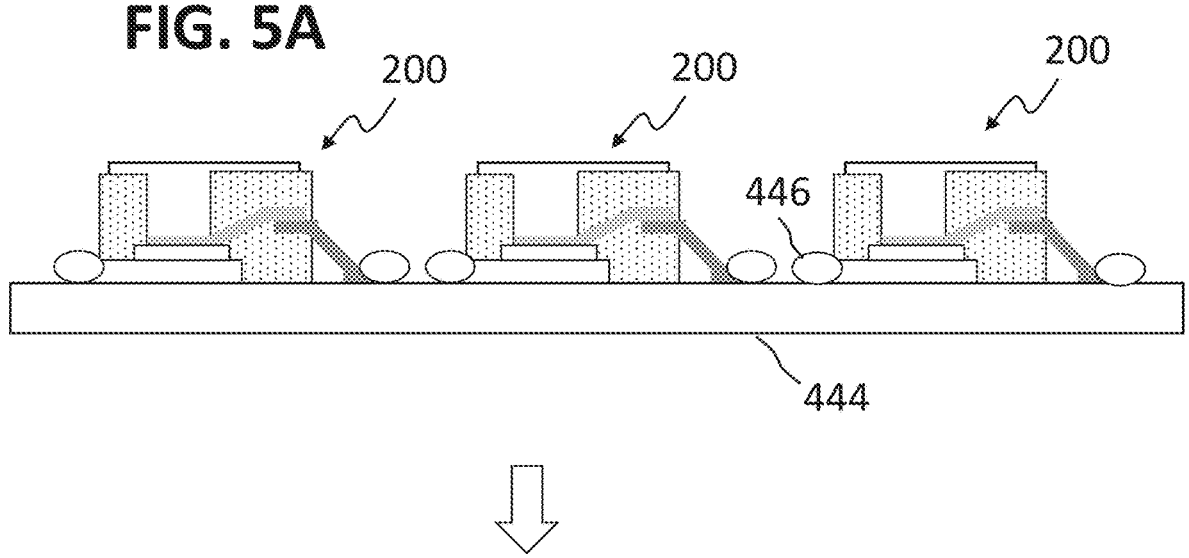
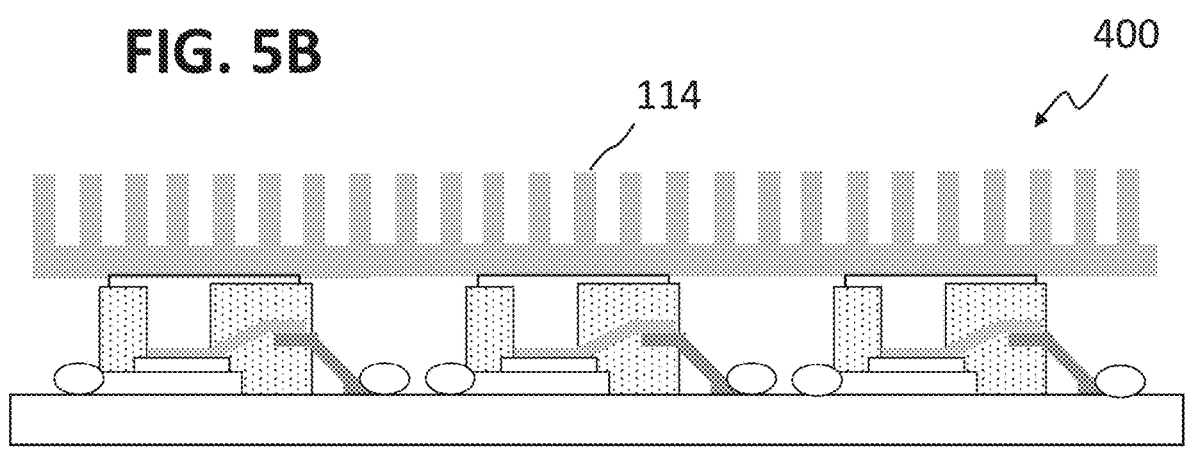

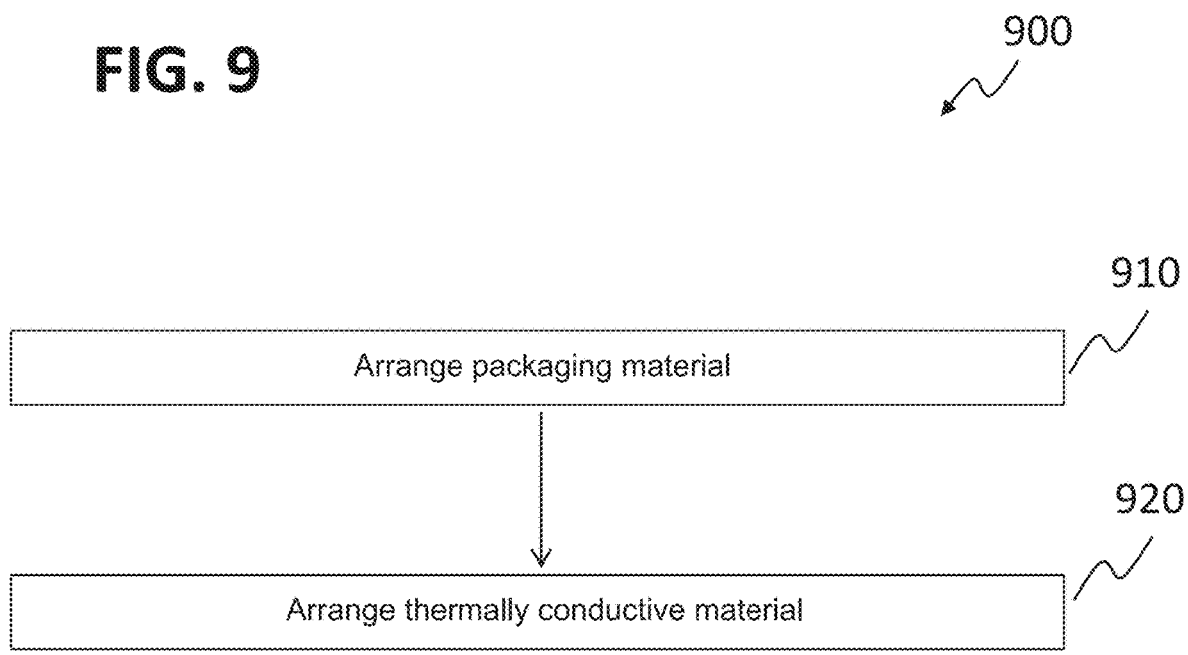

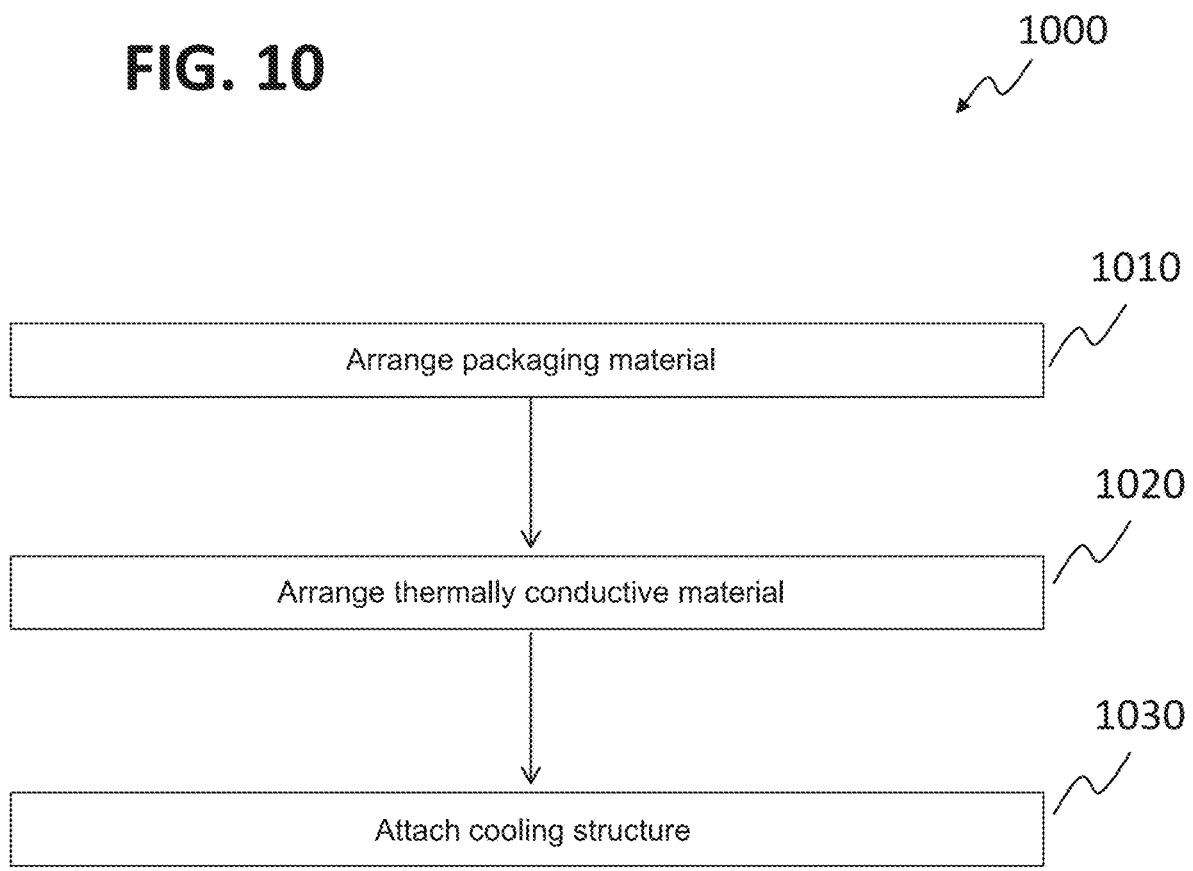

CHIP PACKAGE AND SEMICONDUCTOR ARRANGEMENT HAVING THERMALLY CONDUCTIVE MATERIAL IN CONTACT WITH A SEMICONDUCTOR CHIP AND METHODS OF FORMING THEREOF

TECHNICAL FIELD

Various embodiments relate generally to a chip package, a semiconductor arrangement, a method of forming a chip package, and a method of forming a semiconductor arrangement.

BACKGROUND

It is known to attach a cooling structure onto one side of a chip package in order to dissipate heat away from the chip and prevent it from overheating. The need for effective heat dissipation is particularly important for devices such as power semiconductor chips which operate in high power and/or voltage conditions. However, in some instances, the increasing demand for greater computing performance and/or higher voltage have led to increasing heat dissipation requirements which are difficult to meet using single side cooling solutions.

As a result, dual side cooling arrangements where cooling structures are provided on two opposing sides of a chip package have evolved as a solution to meet the demand for more efficient heat dissipation. FIG. 1A to 1C are cross-sectional views illustrating a known method for fabricating a chip package 100 with dual side cooling structure. FIGS. 6A and 6B are corresponding schematic diagrams illustrating how chip packages 100 resulting from FIG. 1A to 1C manufacturing methods may look like from the top in some implementations. Referring back to FIG. 1A, the method may comprise attaching a first side of a chip 102 onto a leadframe 104 and attaching a clip 108 to a second opposing side of the chip 102. In the FIG. 1A-1C example, the clip 108 comprises a heat spreader section 108A which is positioned over and thermally coupled to the chip 102 so as to dissipate heat away from the chip 102. The heat spreader section 108A comprises a metallic material such as copper or aluminum. The clip 108 further comprises a connector section 108B whose function is to electrically connect one or more contact pads on the chip 102 to a lead 110 on the leadframe 104. The heat spreader section 108A may be replaced by a heat slug that is attached to a clip instead of being integrally formed as part of the clip. A packaging material 106 such as a mold compound may be formed to enclose the chip 102, the leadframe 104 and partially the clip 108. A top surface of the heat spreader section 108A is exposed by grinding back the packaging material 106. Subsequent process steps such as curing of the mold material 106, removing unwanted portions of the mold material 106 in a de-flashing process, singulation into individual chip packages 100 as well as plating, marking and trimming of the leads may follow thereafter.

As shown in FIG. 1B, a thermal interface material 112 may be formed on the exposed surface of the clip 108, and a cooling structure 114 may be attached to the thermal interface material 112.

In this arrangement, heat may mainly be dissipated from the chip 102 through the heat spreader section 108A of the clip 108, the thermal interface material 112, and the cooling structure 114. Typically, the cooling structure 114 may be mounted over an exposed heat transmitting surface, for example the exposed clip 108 (in FIG. 1A-1C exposed at the package 100 top side) at a customer's side.

However, exposing the top surface of heat spreader section 108A by grinding involves a number of process steps which substantially increases the cost of manufacturing a chip package 100.

By way of example, the associated process steps may include attaching the bottom side of the package 100 to a grinding tape and grinding the top side of the package 100 until a top surface of the heat spreader section 108A of the clip 108 is exposed. A washing process is then carried out to rinse away dust from the grinding process, followed by removal of the grinding tape from the package 100 for example by illuminating the grinding tape with ultraviolet light. The foregoing four processes are a major cost adder. In particular large packages 100, where the additional costs are to be shared by fewer individual chip packages 100 compared to small chip packages 100, may suffer from increased costs.

SUMMARY

A chip package including a semiconductor chip is provided. The chip package may include a packaging material at least partially around the semiconductor chip with an opening extending from a top surface of the packaging material to the chip and/or to an electrical contact structure contacting the chip, and a thermally conductive material in the opening, wherein the thermally conductive material is configured to transfer heat from the chip to an outside, wherein the thermally conductive material extends laterally at least partially over the top surface of the packaging material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3J illustrate, as a sequence of schematic cross-sectional views, a method of forming a semiconductor arrangement including a chip package according to various embodiments;

FIGS. 4A to 4C illustrate, as a sequence of schematic cross-sectional views, a method of forming a semiconductor arrangement according to various embodiments;

FIGS. 5A and 5B illustrate, as a sequence of schematic cross-sectional views, a method of forming a semiconductor arrangement according to various embodiments;

Figure 6A:
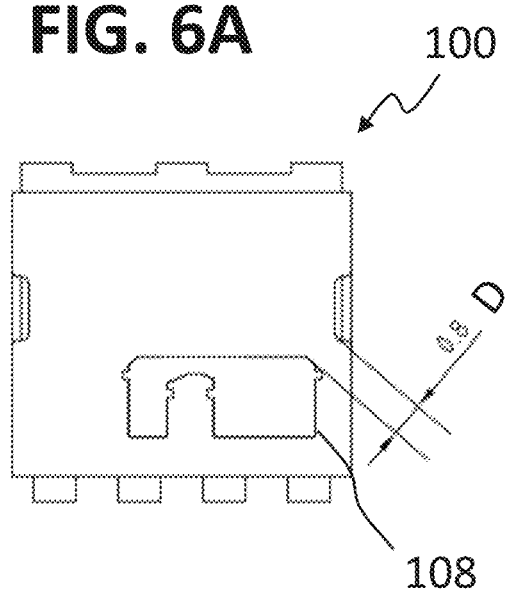
Figure 6B:
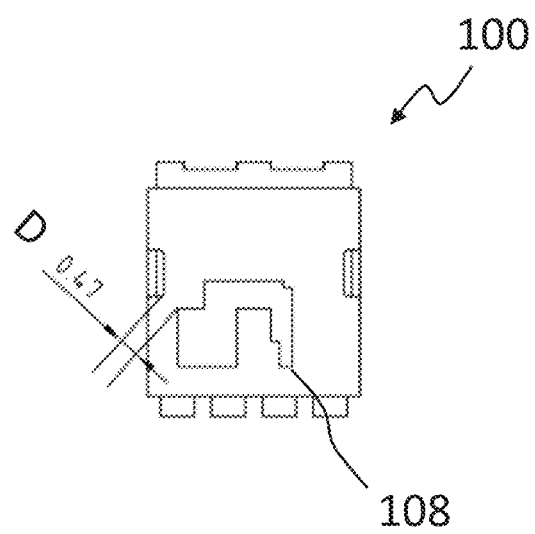
Figure 8A:
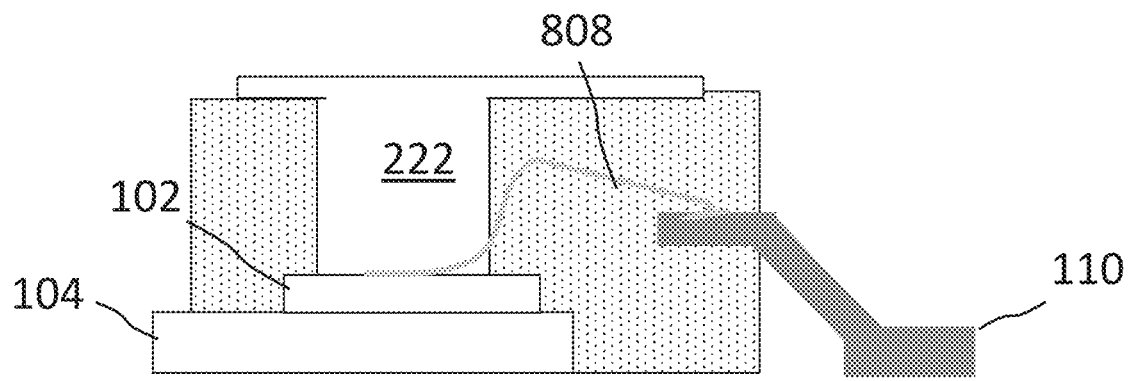
Figure 8B:
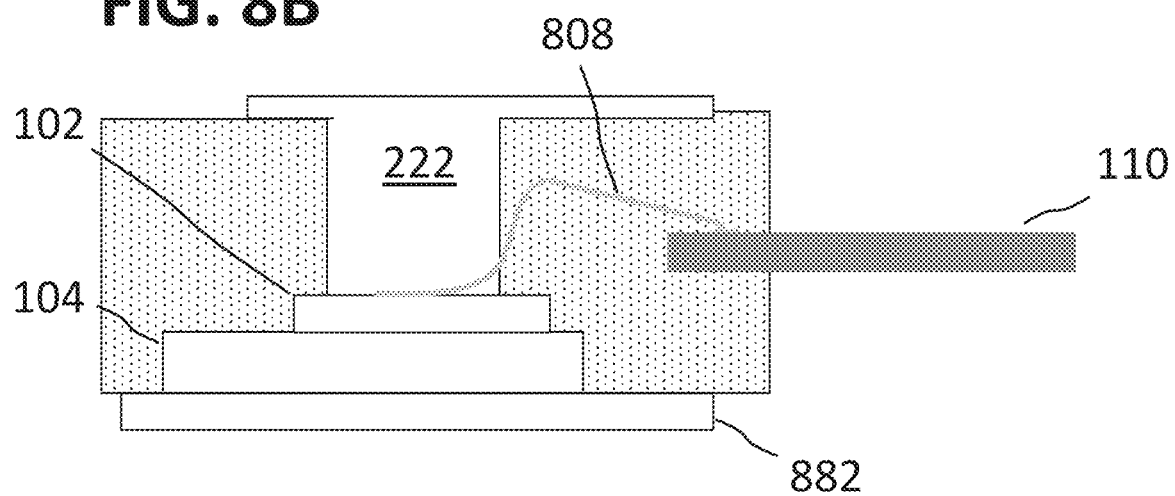
Figure 8C:
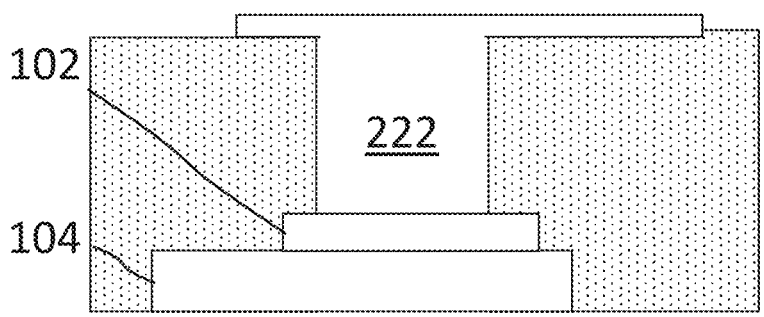

each of FIGS. 6A and 6B shows a schematic top view of a chip package according to prior art;

each of FIGS. 7A to 7G shows a schematic top view of a chip package in accordance with various embodiments;

each of FIGS. 8A to 8C shows a schematic cross-sectional view of a chip package according to various embodiments;

FIG. 9 shows a flow diagram of a method of forming a chip package in accordance with various embodiments; and FIG. 10 shows a flow diagram of a method of forming a semiconductor arrangement in accordance with various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "thermally conductive material", "thermally conductive path", and the like, may be used herein, unless otherwise indicated, for a material, a path, etc., with a relatively high thermal conductivity, for example with a thermal conductivity that is higher than a thermal conductivity of packaging material (e.g., a mold compound) used in the package. Exemplary materials (e.g., forming the path) may include so-called thermal interface materials, also referred to as gap fillers, composite materials including a base material of low(er) thermal conductivity and an additional material, for example filler particles, with a high(er) thermal conductivity to form, in total, a thermally conductive material, metals, and other suitable materials used in the art with the purpose of transferring heat.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a chip package with a cooling structure and a respective method of forming a chip package are provided. The chip package may have a thermally conductive material that may be partially arranged over a top surface of a packaging material exposed to an outside of the chip package. The thermally conductive material may form of be part of a thermal path from the chip to the outside of the chip package and may be configured to transfer heat from the chip to the outside of the chip package.

The thermally conductive material partially arranged over a top surface of the packaging material may be indicative of an easy manufacturing method that may include forming the packaging material with an opening over the chip and filling the opening with the thermally conductive material until it overflows. This means that the exposed thermally conductive material may be provided without the high-cost grinding process.

Furthermore, the overflowing may serve to make sure that no voids, i.e., regions free from the thermally conductive material, remain in the opening. Thereby, a high thermal conductivity between the chip and the outside may be ensured in an easy way.

Moreover, the thermally conductive material partially arranged over a top surface of the packaging material may protrude sufficiently to allow for an easy attachment of a cooling structure.

Furthermore, the thermally conductive material partially arranged over a top surface of the packaging material may allow to define a (lateral) shape of the thermally conductive material as desired in an easy way. In particular, a (lateral) area of the thermally conductive material may be larger than a (lateral) surface area of the chip or a (lateral) surface area of a clip that may be attached to the chip.

In various embodiments, if an electrically isolating thermally conductive material is used, the thermally conductive material partially arranged over a top surface of the packaging material may serve to increase a creepage distance of the chip package.

The thermally conductive material may be provided in addition to metal leads electrically contacting the chip, at least some of which, e.g. a leadframe, may additionally serve as a cooling structure, e.g. for dual-side cooling (DSC), e.g. heterogeneous dual-side cooling.

FIGS. 2A to 2D and FIGS. 3A to 3I illustrate, as sequences of schematic cross-sectional views, a method of forming a chip package 200 according to various embodiments. FIG. 3J illustrates, as a schematic cross-sectional view, a method of forming a semiconductor arrangement using a chip package 200 according to various embodiments as described in context with, e.g., FIGS. 3A to 3I.

FIGS. 4A to 4C and FIGS. 5A and 5B, respectively, illustrate, as sequences of schematic cross-sectional views, a method of forming a semiconductor arrangement 400 according to various embodiments.

Each of FIGS. 7A to 7G shows a schematic top view of a chip package 200 in accordance with various embodiments, and each of FIGS. 8A to 8C shows a schematic cross-sectional view of a chip package 200 according to various embodiments.

The chip package 200 may in various embodiments include a semiconductor chip 102 ("chip" for short), for example a transistor, a diode or the like, for example a power chip, e.g. a power transistor or a power diode or the like.

The chip 102 may in various embodiments be attached to a carrier 104, for example a leadframe. The carrier 104, e.g. the leadframe, may in various embodiments be configured to mechanically support the chip 102 and/or to provide electrical leads from an outside of the chip package 200 to chip contacts. In addition, the carrier 104 may be configured as a cooling structure.

The chip package 200 may in various embodiments include a packaging material 106 at least partially around the semiconductor chip 102 with an opening 220 extending from a top surface 106T of the packaging material 106 to the chip 102 and/or to an electrical contact structure 108, 808 contacting the chip 102.

The electrical contact structure 108, 808 may in principle include any kind of electrical contact structure typically used for contacting the chip 102 and suitable for being at least partially encapsulated by the packaging material 106, for example bonding wires 808, bonding ribbons, clips 108, and the like. However, at least in some embodiments a clip 108 may differ from bonding wires and the like in that the clip may be sufficiently large that it may cover the whole chip 102, such that only a surface of the clip may be exposed through the opening 220, whereas in the case of the bonding wire 808, the ribbon, a small/narrow clip, or the like, at least a portion of the chip 102 may be exposed together with at least a portion of the electrical contact structure 108, 808 through the opening 220.

Figure 3A:
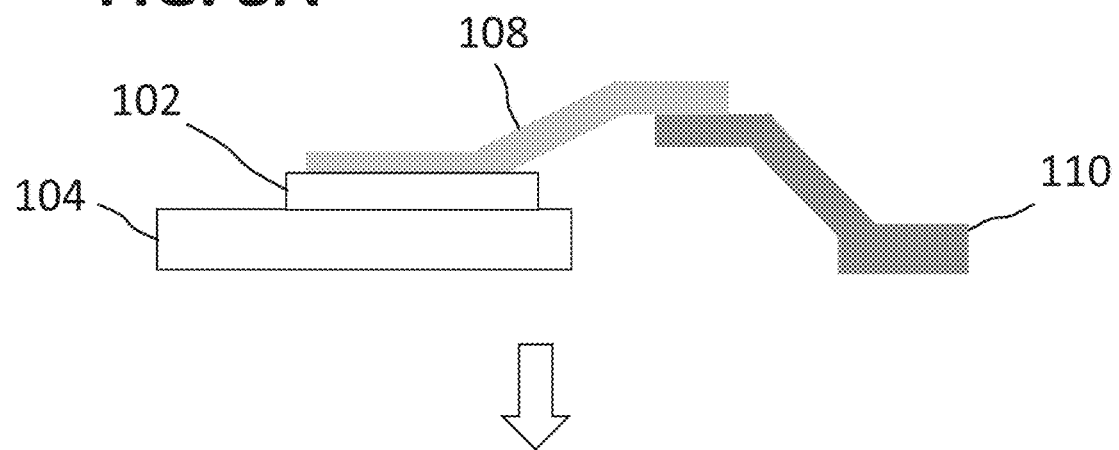
Figure 3B:
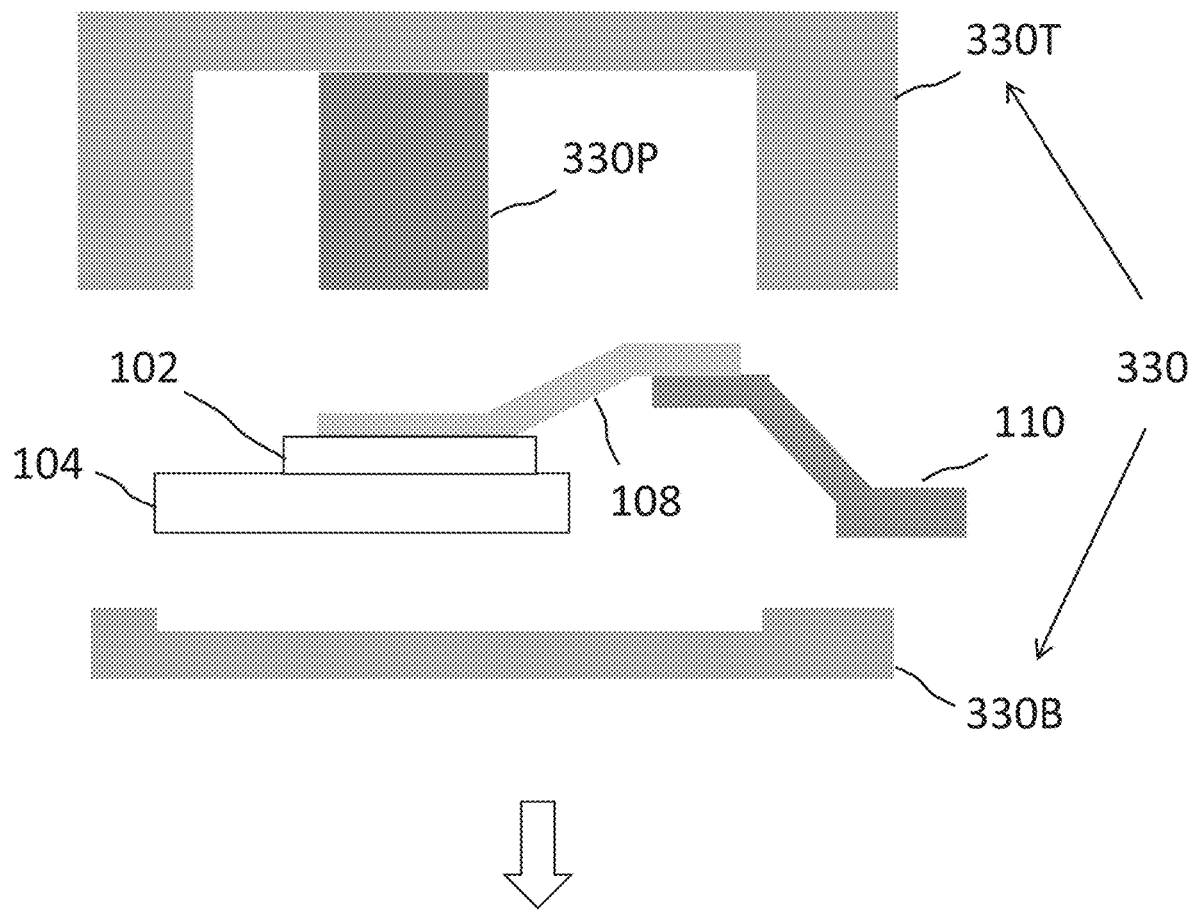
Figure 3C:
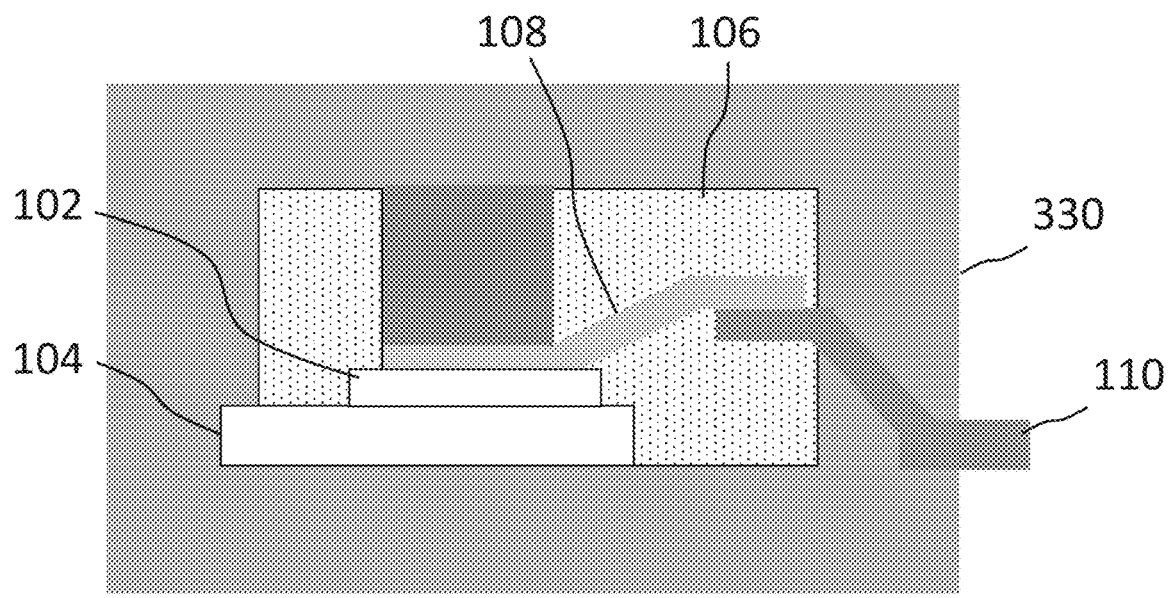
Figure 3D:
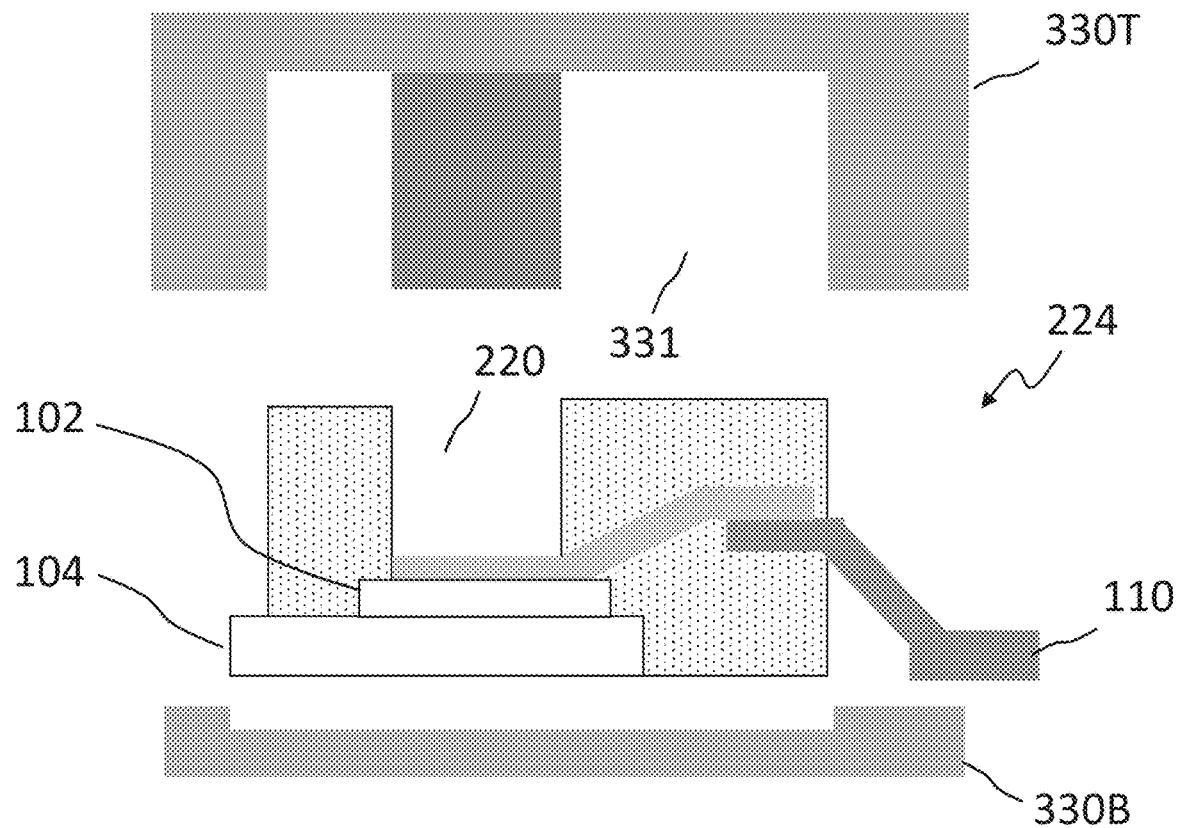
Figure 3E:
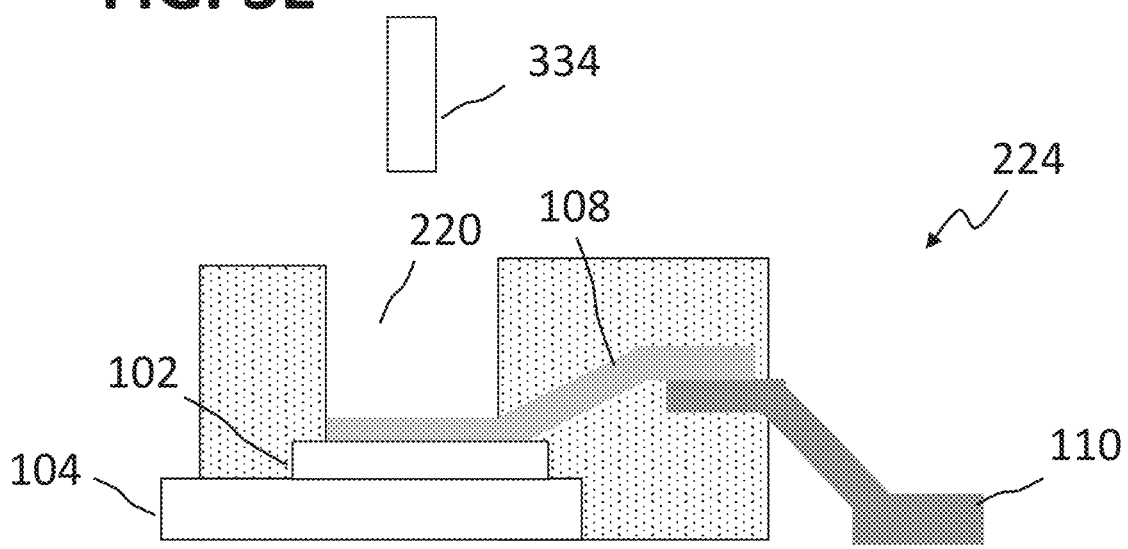
Figure 3F:
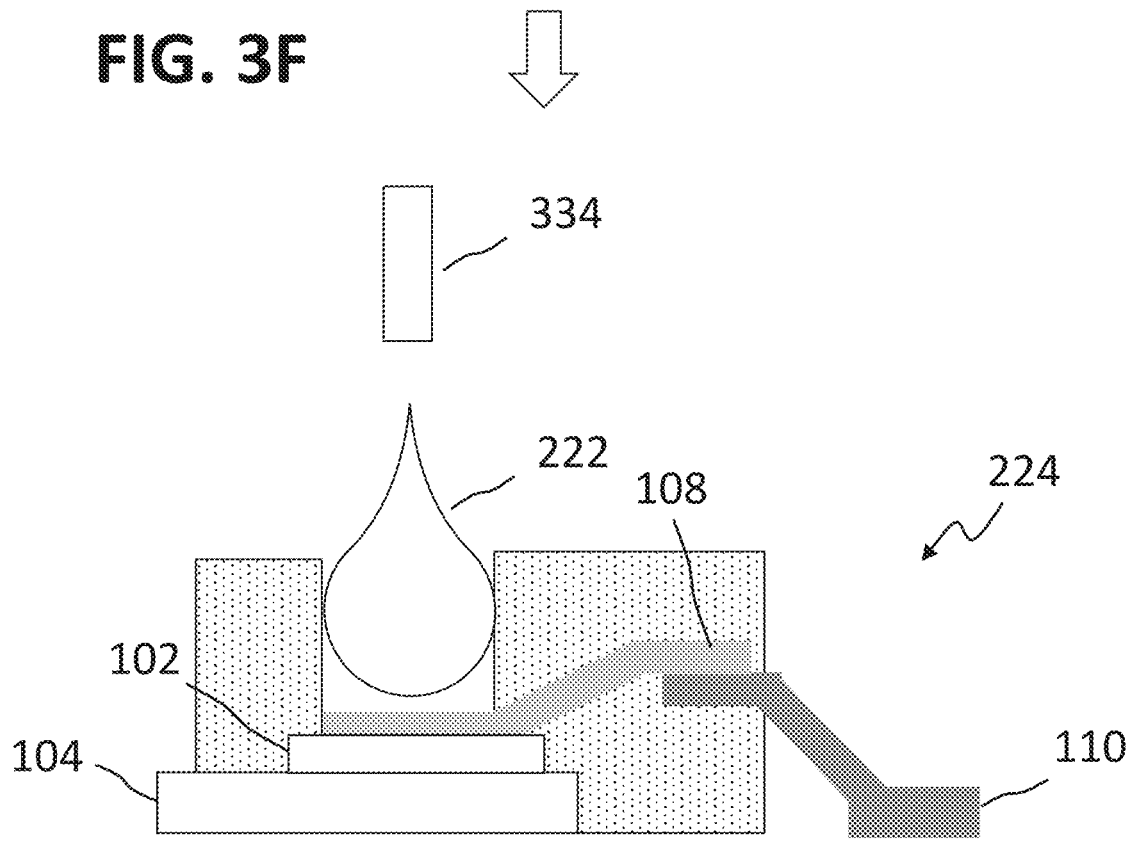
Figure 3I:
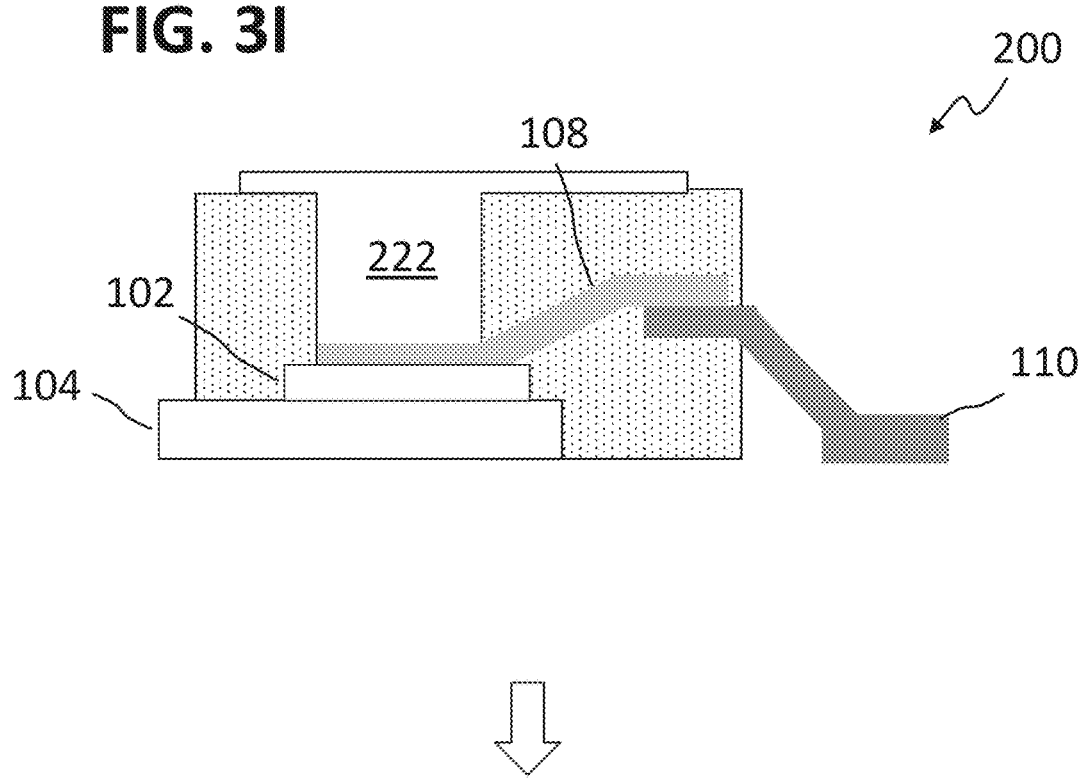
Figure 3J:
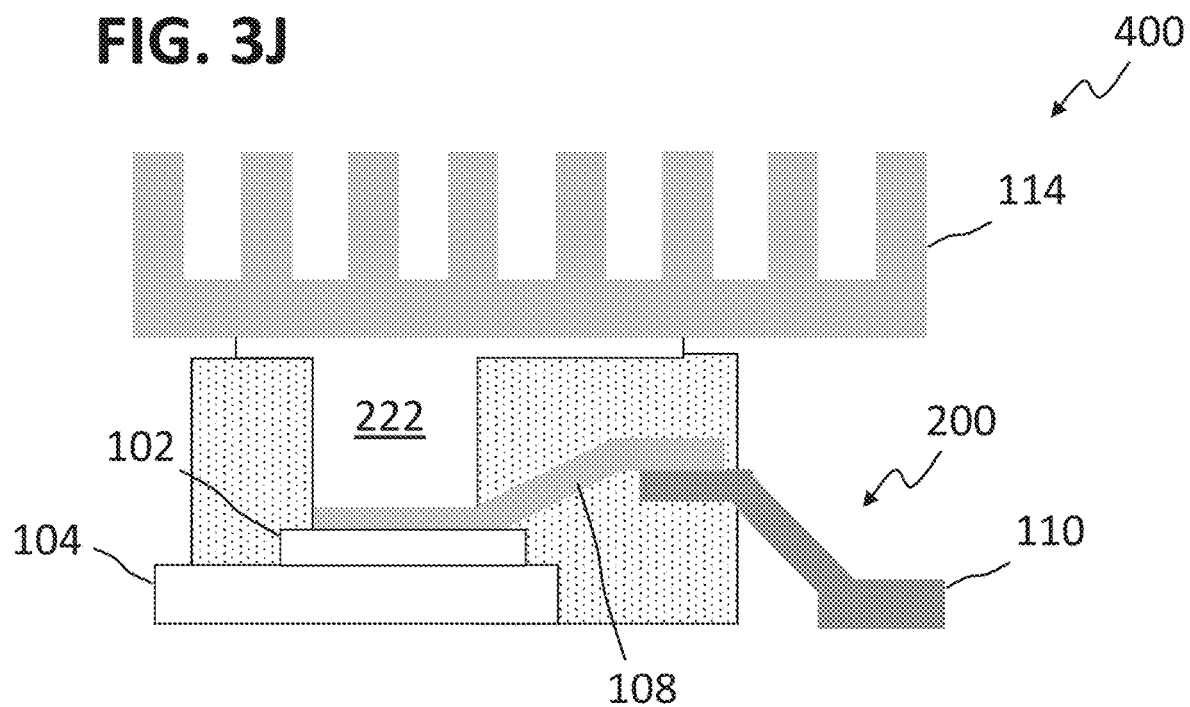

The opening 220 in the packaging material 106 may in various embodiments be formed as described in context with the exemplary visualization of FIG. 3B to 3D: A mold 330 (in this case a two-part mold 330 including a top mold 330T and a bottom mold 330B) are arranged around the chip 102 (and the carrier 104). The top mold 330T may be provided with a protrusion 330P that may be arranged above the chip 102, e.g. in direct or indirect contact with the chip 102, e.g. on the clip 108, e.g. in direct physical contact with the clip 108. A cavity 331 formed by the mold 330 may be filled with the packaging material 106 (which may be in a viscous state) essentially as known in the art, e.g. by compression molding, and cured.

Removing the mold 330 may leave the opening 220 where the protrusion 330P had been arranged. The mold 330 may be formed from a single material or from a combination of materials, for example using a different, e.g. softer, material for the protrusion 330P or for parts of the protrusion 330P.

The opening 220 may in various embodiments may be a blind hole that is open only at a top surface 106T of the packaging material 106, with the packaging material 106 forming the sidewalls, and the electrical contact structure 108 closing the bottom of the opening 220. The packaging material 106 may in various embodiments be formed completely around the semiconductor chip 102.

The chip package 200 may in various embodiments include a thermally conductive material 222 in the opening 220. The thermally conductive material 222 may be configured to transfer heat from the chip 102 to an outside. For example, the thermally conductive material 222 may include or consist of a material with a thermal conductivity of at least 1 W/m K, for example at least 5 W/m K, for example at least 10 W/m K. The thermal conductivity of the thermally conductive material 222 may be higher than a thermal conductivity of the packaging material 106.

In various embodiments, the thermally conductive material 222 may be arranged in the opening 220 in a viscous state (see FIGS. 3F and 3G for illustrative examples), for example using a nozzle 334, and/or compression molding. The thermally conductive material 222 may in various embodiments be cured later. Thus, a shape of the opening 220 with closed bottom and side walls, as described above, may be particularly suitable for filling the opening 220 with the thermally conductive material 222 without risking the thermally conductive material 222 to flow out of the opening 220, except when the opening 220 is completely filled and the thermally conductive material 222 flows over the top surface 106T of the packaging material 106 as desired.

By forming the opening 220 during the encapsulation process (when arranging the packaging material 106) and filling the opening 220 with the thermally conductive material 222, the grinding process of the prior art for exposing the thermally conductive material (in that case, the clip 108) may be avoided.

The thermally conductive material 222 overflowing onto the top surface 106T of the packaging material 106 may lead to the thermally conductive material 222 extending laterally at least partially over the top surface 106T of the packaging material 106.

The overflowing thermally conductive material 222 may be shaped by using a second mold 338. Using the second mold 338 with a preformed mold cavity may allow to achieve a consistent and easily controllable shape of the thermally conductive material 222.

Figure 1A:
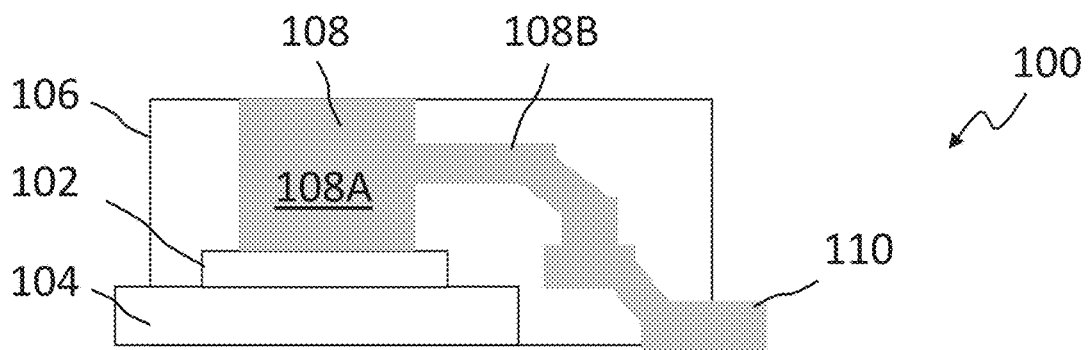
FIGS. 1A to 1C shows schematic cross-sectional views illustrating a method of forming a semiconductor arrangement according to prior art.
Figure 1B:
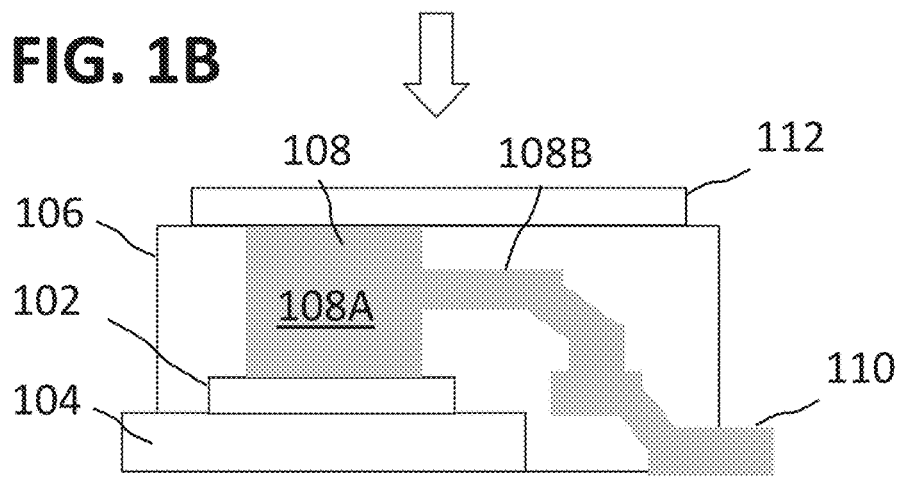
Figure 1C:
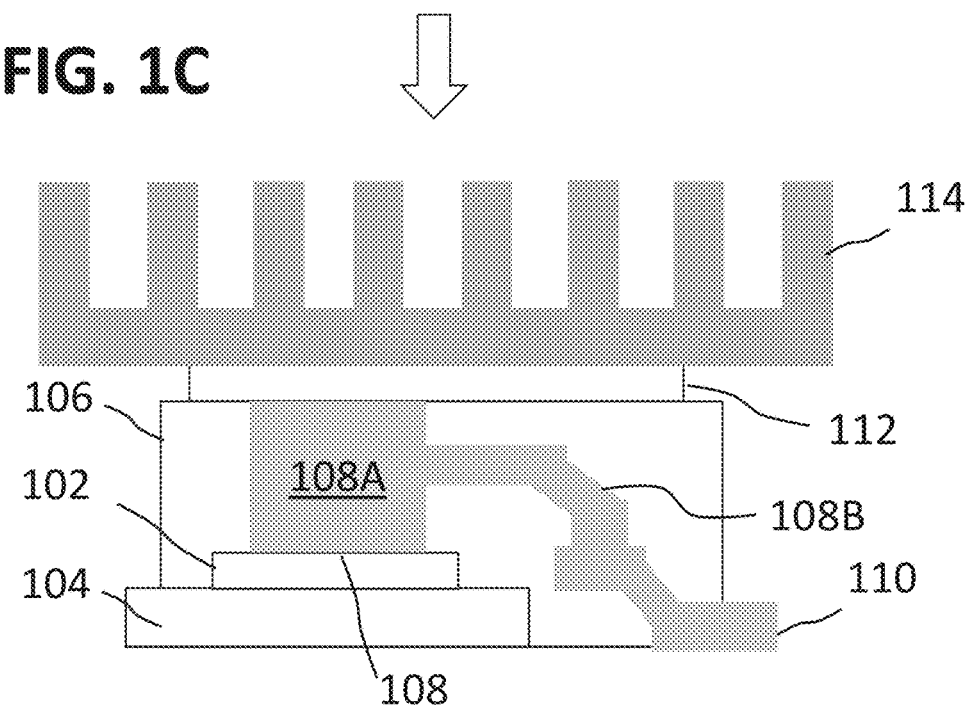
Figure 2A:
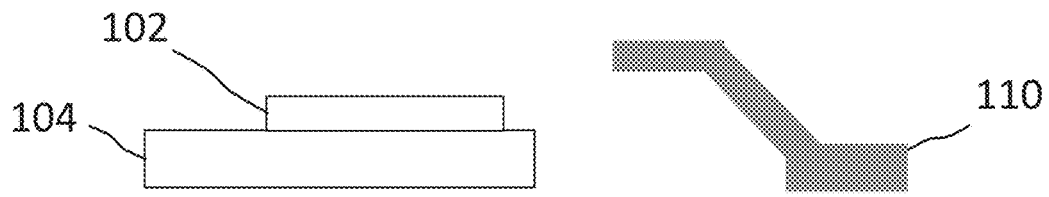
FIGS. 2A to 2D illustrate, as a sequence of schematic cross-sectional views, a method of forming a chip package according to various embodiments.
Figure 2B:
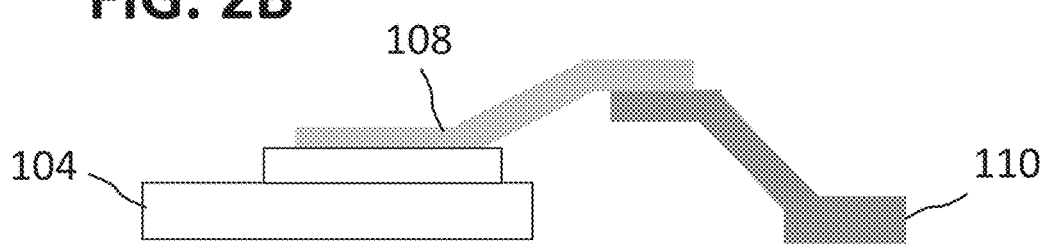
Figure 2C:
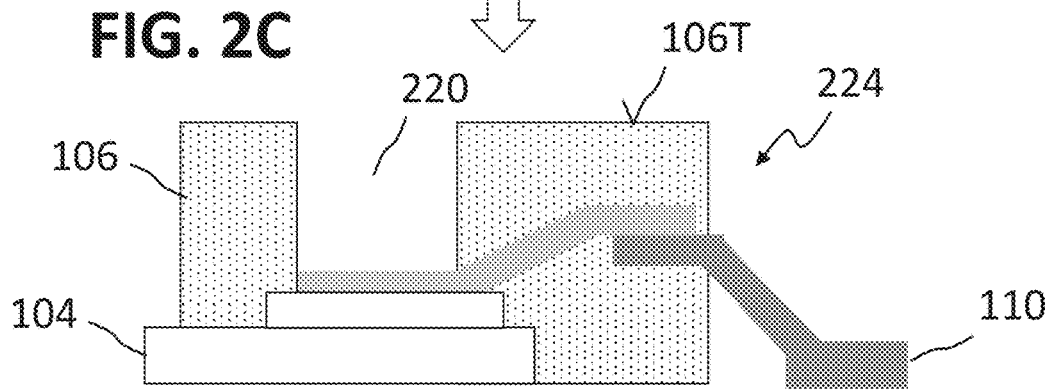
Figure 2D:
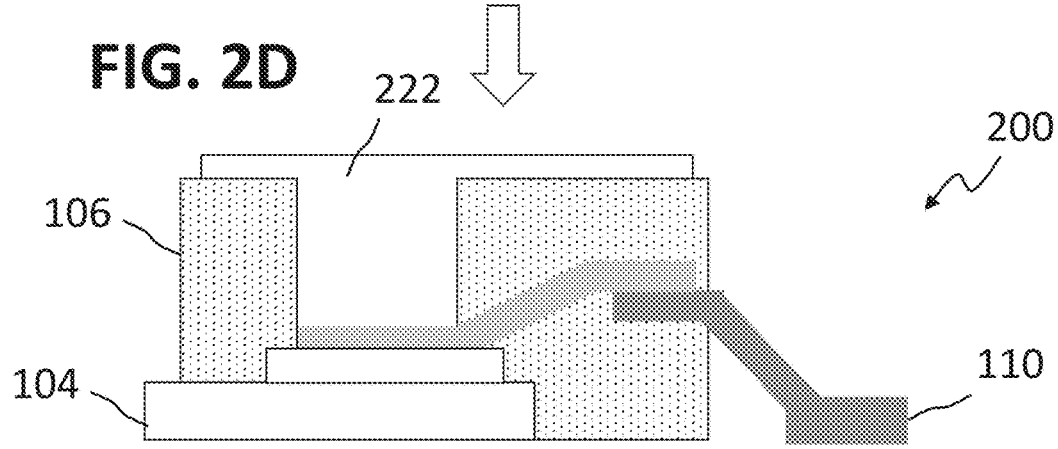

A lateral extension of the thermally conductive material 222 over the top surface 106T of the packaging material 106 may in various embodiments be shaped as required by the application. FIG. 7A to 7G show exemplary embodiments. As shown in particular by a comparison with the prior art chip packages 100 of FIGS. 6A and 6B, a creepage distance D may be increased in a case of using an electrically isolating thermally conductive material 222. Furthermore, lateral extension of the thermally conductive material 222 beyond the opening 220 and onto the top surface 106T of the packaging material 106 also results in a larger heat dissipation surface compared to the exposed top surface of the clip 108 in FIG. 1A-1C of a known structure.

Figure 7A:
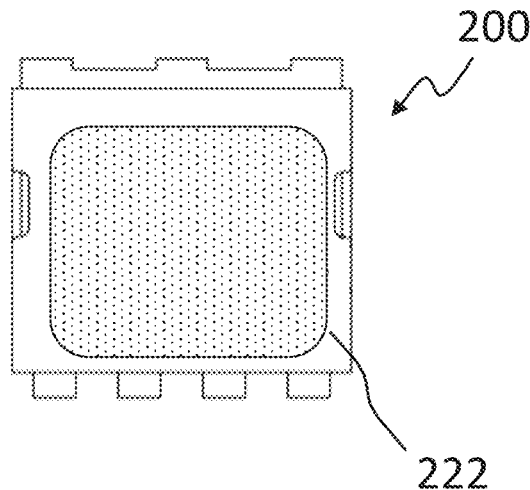
Figure 7B:
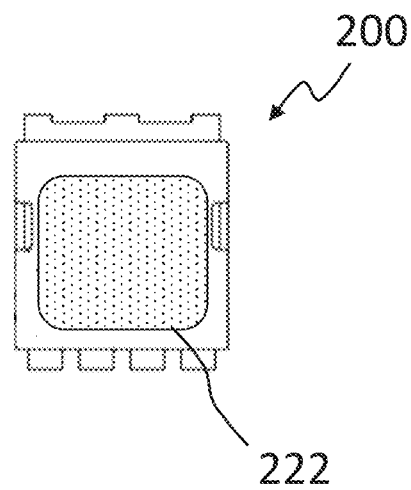
Figure 7C:
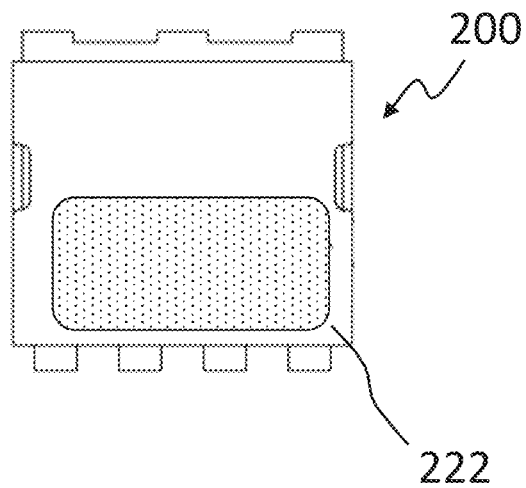
Figure 7D:
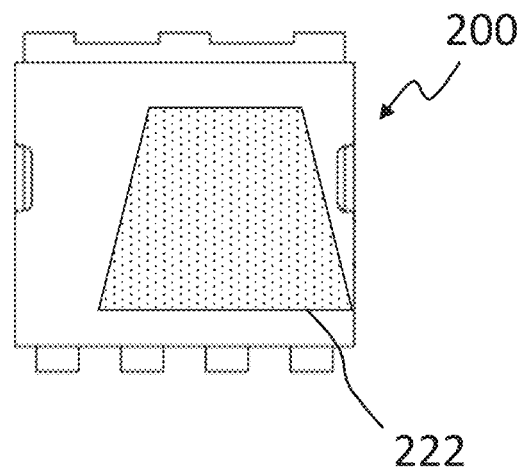
Figure 7E:
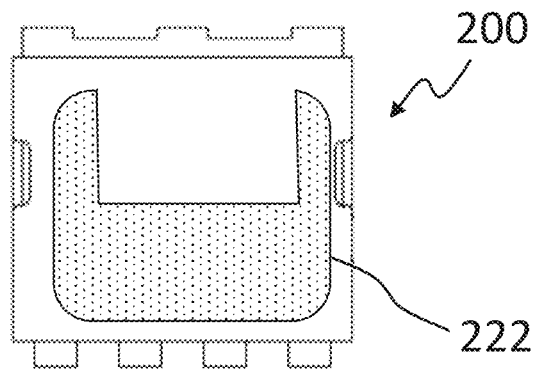
Figure 7F:
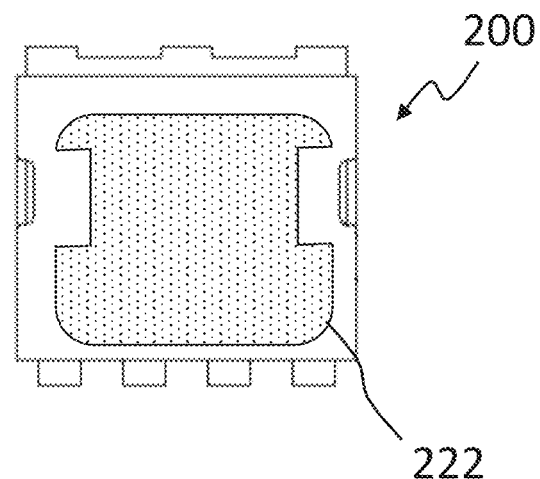
Figure 7G:
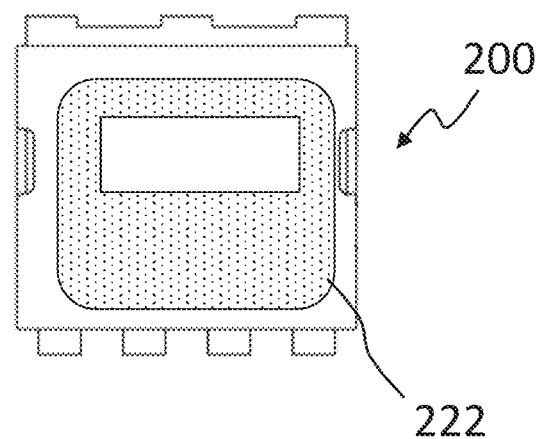

Of the embodiments shown in FIG. 7A to FIG. 7G, the thermally conductive material 222 of FIG. 7A may have the largest surface area exposed to the outside of the package 200, and may therefore be advantageous over the embodiments of FIG. 7B to 7G in terms of heat dissipation. However, the configurations of the thermally conductive material 222 of FIG. 7B to FIG. 7G may have other application specific advantages, for example for a mounting of a cooling structure 114, as alignment marks, or other purposes.

In various embodiments, the thermally conductive material 222 may completely cover the top surface 106T of the packaging material 106, and may optionally further cover at least one outer side surface, optionally all outer side surfaces, of the chip package 200. An illustrative example is shown in FIG. 4B, where the thermally conductive material 222 is arranged to completely encapsulate the chip package 200 from five sides, leaving only a bottom side of the chip package 200, where the carrier 104 is arranged, free from the thermally conductive material 222.

The thermally conductive material 222 may in various embodiments be electrically isolating, for example in the chip packages 200 of FIG. 4B (which are part of the semiconductor arrangement 400 of FIG. 4C), because otherwise the leadframe 104 and the clip 108 may be shorted, or in any of the other embodiments shown in the figures.

The thermally conductive material 222 may in various embodiments be electrically conductive, for example in any of the embodiments shown in the figures with the exception of FIG. 4B, 4C and FIG. 7A to 7G, because there the thermally conductive material 222 is in direct contact with and/or arranged close to more than one metal contact, which could cause an electrical short or decrease a creepage distance. In the exemplary embodiment of FIG. 8C, the thermally conductive material 222 may for example be configured as an electrically conductive material for electrically contacting the backside of the chip 102 exposed in the opening 220.

In various embodiments, an electrically conductive thermally conductive material 222 may for example be chosen for its high thermal conductivity.

In various embodiments, the thermally conductive material 222 may include or consist of a thermal interface material, for example silicone with filler particles having a higher thermal conductivity than the silicone, for example aluminum oxide particles or the like, or an electrically conductive glue. Silicone is a stable material with good electrical insulation properties, but may not have the desired thermal conductivity desired.

In various embodiments, the chip package 200 may be completed, in particular, the thermally conductive material 222 may be arranged, before the chip package 200 is delivered to a customer.

In various embodiments, the chip package 200 may be delivered to a customer before the thermally conductive material 222 is arranged. This may allow the customer to use the thermally conductive material 222 of their choice, and optionally, e.g. if the thermally conductive material 222 has adhesive properties, to use it as a mounting material for the cooling structure 114. In various embodiments, the cooling structure 114 may serve as the mold. In other words, the cooling structure 114 may have its bottom surface shaped in such a way that it may be suitable for defining the lateral shape of the thermally conductive material on the top surface 106T of the packaging material 106, and may at the same time be attached to the chip package 200 to form the semiconductor arrangement 400.

The cooling structure is not limited to the form illustrated in the Figures. For example, in various embodiments, as an alternative to mounting the cooling structure or in addition to it, a water cooler may be arranged for cooling the chip package 200, e.g. the thermally conductive material 222. The cooling structure may also be a single block of material instead of comprising multi fin like dissipative structures like in the figures.

In various embodiments, the semiconductor arrangement 400 may include at least one chip package 200 in accordance with various embodiments, for example as described above, and at least one cooling structure 114 attached to the thermally conductive material 222. An exemplary embodiment of a single semiconductor arrangement 400 is shown in FIG. 3J.

Exemplary embodiments of semiconductor arrangements 400 including a plurality of chip packages 200 combined with a single cooling structure 114 attached to the plurality of chip packages 200 (in particular, to the thermally conductive material 222 of each of the chip packages 200) are shown in FIGS. 4C and 5B.

In various embodiments, a plurality of cooling structures 114 may be provided, each of which may be attached to one or more chip packages 200, i.e. their respective exposed thermally conductive material 222.

In various embodiments, the thermally conductive material 222 of at least two of the plurality of chip packages 200 may form an integral structure. An exemplary embodiment is shown in FIGS. 4B and 4C, where the thermally conductive material 222 additionally extends between the at least two chip packages 200.

In various embodiments, the chip packages 200 may be soldered (e.g., using a solder 446) onto a board 444, e.g. a printed circuit board. Mounting the chip packages 200 (or rather, the chip packages 200 lacking the thermally conductive material 222) before the thermally conductive material 222 is arranged, avoids subjecting the thermally conductive material 222 to a high temperature reflow associated with the mounting process.

By spreading the thermally conductive material 222 across the plurality of chip packages, assembly costs may be reduced.

In various embodiments, the above described five processes of the prior art required for exposing the thermally conductive material, i.e. the taping, grinding, washing, illumination with ultraviolet light and the detaping, may be replaced by a fewer number of processes. The replacement processes may include the arranging the thermally conductive material 222 in the opening, e.g. by dispensing and/or molding, e.g. compression molding. Optionally, the thermally conductive material 222 may require curing. By reducing the number of processes, and additionally by avoiding the expensive grinding process, the thermally conductive path between the outside of the chip package 200 and the chip 102 may be provided at substantially lower cost than in the prior art.

The cooling structure 114 may be configured as a cooling structure as known in the art, for example, include or consist of a material, e.g. metal, with a high thermal conductivity, and may for example be structured with fins, channels or the like to increase a surface exposed to a cooling medium, e.g. air.

FIG. 9 shows a flow diagram 900 of a method of forming a chip package in accordance with various embodiments.

The method may include arranging a packaging material at least partially around the semiconductor chip with an opening extending from a top surface of the packaging material to the chip and/or to an electrical contact structure contacting the chip (in 910), arranging a thermally conductive material in the opening such that it extends laterally at least partially over the top surface of the packaging material, wherein the thermally conductive material is configured to transfer heat from the chip to an outside (in 920).

FIG. 10 shows a flow diagram 1000 of a method of forming a semiconductor arrangement in accordance with various embodiments.

The method may include arranging a packaging material at least partially around the semiconductor chip with an opening extending from a top surface of the packaging material to the chip and/or to an electrical contact structure contacting the chip (in 1010), arranging a thermally conductive material in the opening such that it extends laterally at least partially over the top surface of the packaging material, wherein the thermally conductive material is configured to transfer heat from the chip to an outside (in 1020), and attaching a cooling structure to the thermally conductive material (in 1030).

Various examples will be illustrated in the following:

Example 1 is a chip package including a semiconductor chip, a packaging material at least partially around the semiconductor chip with an opening extending from a top surface of the packaging material to the chip and/or to an electrical contact structure contacting the chip, and a thermally conductive material in the opening, wherein the thermally conductive material is configured to transfer heat from the chip to an outside, wherein the thermally conductive material extends laterally at least partially over the top surface of the packaging material.

In Example 2, the subject matter of Example 1 may optionally further include that the packaging material is formed completely around the semiconductor chip.

In Example 3, the subject matter of Example 1 or 2 may optionally further include that the thermally conductive material completely fills the opening.

In Example 4, the subject matter of any of Examples 1 to 3 may optionally further include that the thermally conductive material covers the top surface only partially.

In Example 5, the subject matter of any of Examples 1 to 3 may optionally further include that the thermally conductive material completely covers the top surface.

In Example 6, the subject matter of Example 5 may optionally further include that the thermally conductive material further covers at least one outer side surface, optionally all outer side surfaces, of the chip package.

In Example 7, the subject matter of any of Examples 1 to 6 may optionally further include a clip mounted on the chip, wherein the thermally conductive material is arranged in direct physical contact with the clip.

In Example 8, the subject matter of any of Examples 1 to 7 may optionally further include that the thermally conductive material is arranged in direct physical contact with the chip.

In Example 9, the subject matter of any of Examples 1 to 7 may optionally further include that the thermally conductive material is electrically isolating.

In Example 10, the subject matter of any of Examples 1 to 9 may optionally further include that the thermally conductive material is electrically conductive.

In Example 11, the subject matter of any of Examples 1 to 10 may optionally further include that the thermally conductive material is a cured material.

In Example 12, the subject matter of any of Examples 1 to 11 may optionally further include that the thermally conductive material comprises or consists of a material with a higher thermal conductivity than the packaging material, optionally a thermal conductivity of at least 1 W/m K.

In Example 13, the subject matter of any of Examples 1 to 12 may optionally further include that the thermally conductive material comprises or consists of silicone with filler particles having a higher thermal conductivity than the silicone, for example aluminum oxide particles.

Example 14 is a semiconductor arrangement including at least one chip package in accordance with any of Examples 1 to 13, and at least one cooling structure attached to the thermally conductive material.

In Example 15, the subject matter of Example 14 may optionally further include that the at least one chip package includes a plurality of chip packages, wherein the at least one cooling structure is attached to the respective thermally conductive material of at least two of the plurality of chip packages.

In Example 16, the subject matter of Example 14 or 15 may optionally further include that the at least one chip package includes a plurality of chip packages, and that the thermally conductive material of at least two of the plurality of chip packages forms an integral structure.

In Example 17, the subject matter of Example 16 may optionally further include that the thermally conductive material additionally extends between the at least two chip packages.

Example 18 is a method of forming a chip package, the method including arranging a packaging material at least partially around the semiconductor chip with an opening extending from a top surface of the packaging material to the chip and/or to an electrical contact structure contacting the chip, arranging a thermally conductive material in the opening such that it extends laterally at least partially over the top surface of the packaging material, wherein the thermally conductive material is configured to transfer heat from the chip to an outside.

In Example 19, the subject matter of Example 18 may optionally further include that the packaging material is formed completely around the semiconductor chip.

In Example 20, the subject matter of Example 18 or 19 may optionally further include that the thermally conductive material completely fills the opening.

In Example 21, the subject matter of any of Examples 18 to 20 may optionally further include that the arranging a thermally conductive material in the opening includes filling the opening with the thermally conductive material in a viscous state until the thermally conductive material flows over the top surface of the packaging material.

In Example 22, the subject matter of any of Examples 18 to 21 may optionally further include curing the thermally conductive material.

In Example 23, the subject matter of any of Examples 18 to 22 may optionally further include that the thermally conductive material covers the top surface only partially.

In Example 24, the subject matter of any of Examples 18 to 22 may optionally further include that the thermally conductive material completely covers the top surface.

In Example 25, the subject matter of Example 24 may optionally further include that the thermally conductive material further covers least one outer side surface, optionally all outer side surfaces, of the chip package.

In Example 26, the subject matter of any of Examples 18 to 25 may optionally further include that the packaging material is formed completely around the semiconductor chip.

In Example 27, the subject matter of any of Examples 18 to 26 may optionally further include that the thermally conductive material is arranged in direct physical contact with the chip.

In Example 28, the subject matter of any of Examples 18 to 26 may optionally further include mounting a clip on the chip, wherein the thermally conductive material is arranged in direct physical contact with the clip.

In Example 29, the subject matter of any of Examples 18 to 28 may optionally further include that the thermally conductive material is electrically isolating.

In Example 30, the subject matter of any of Examples 18 to 28 may optionally further include that the thermally conductive material is electrically conductive.

In Example 31, the subject matter of any of Examples 18 to 30 may optionally further include that the thermally conductive material comprises or consists of a material with a higher thermal conductivity than the packaging material, optionally a thermal conductivity of at least 1 W/m K.

In Example 32, the subject matter of any of Examples 18 to 31 may optionally further include that the thermally conductive material includes or consists of silicone with filler particles having a higher thermal conductivity than the silicone, for example aluminum oxide particles.

Example 33 is a method of forming a semiconductor arrangement including forming a chip package in accordance with the method of any of Examples 18 to 32 and attaching a cooling structure to the thermally conductive material.

In Example 34, the subject matter of Example 33 may optionally further include that the at least one chip package includes a plurality of chip packages, and that the at least one cooling structure is attached to the respective thermally conductive material of at least two of the plurality of chip packages.

In Example 35, the subject matter of Example 33 or 34 may optionally further include that the at least one chip package includes a plurality of chip packages, and that the thermally conductive material of at least two of the plurality of chip packages forms an integral structure.

In Example 36, the subject matter of Example 35 may optionally further include that the thermally conductive material additionally extends between the at least two chip packages.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
    a semiconductor chip;
    an electrical contact structure contacting the semiconductor chip;
    a packaging material at least partially around the semiconductor chip, the packaging material having an opening that extends from a top surface of the packaging material to the semiconductor chip and/or to the electrical contact structure contacting the semiconductor chip; and
    a thermally conductive material in the opening,
    wherein the thermally conductive material is configured to transfer heat from the semiconductor chip to an outside,
    wherein the thermally conductive material extends laterally at least partially over the top surface of the packaging material,
    wherein the thermally conductive material is an electrically isolating thermally conductive material,
    wherein the thermally conductive material is arranged in direct physical contact with the electrical contact structure.

2. The chip package of claim 1, wherein the thermally conductive material covers the top surface only partially.

3. The chip package of claim 1, wherein the electrical contact structure contacting the semiconductor chip comprises a clip mounted on the semiconductor chip.

4. The chip package of claim 1, wherein the thermally conductive material is arranged in direct physical contact with the semiconductor chip.

5. The chip package of claim 1, wherein the thermally conductive material comprises a material with a higher thermal conductivity than the packaging material.

6. The chip package of claim 1, wherein the thermally conductive material comprises silicone with filler particles having a higher thermal conductivity than the silicone.

7. A semiconductor arrangement, comprising:
    at least one chip package comprising:
    a semiconductor chip;
    an electrical contact structure contacting the semiconductor chip;
    a packaging material at least partially around the semiconductor chip, the packaging material having an opening that extends from a top surface of the packaging material to the semiconductor chip and/or to the electrical contact structure contacting the semiconductor chip;
    a thermally conductive material in the opening, wherein the thermally conductive material is configured to transfer heat from the semiconductor chip to an outside, wherein the thermally conductive material extends laterally at least partially over the top surface of the packaging material, wherein the thermally conductive material is an electrically isolating thermally conductive material; and
    at least one cooling structure attached to the thermally conductive material,
    wherein the thermally conductive material is arranged in direct physical contact with the electrical contact structure.

8. The semiconductor arrangement of claim 7, comprising a plurality of the chip packages, wherein the at least one cooling structure is attached to the respective thermally conductive material of at least two of the plurality of chip packages.

9. The semiconductor arrangement of claim 7, comprising a plurality of the chip packages, wherein the thermally conductive material of at least two of the plurality of chip packages form an integral structure.

10. A method of forming a chip package, the method comprising:
    arranging a packaging material at least partially around a semiconductor chip, the packaging material having an opening extending from a top surface of the packaging material to the semiconductor chip and/or to an electrical contact structure contacting the semiconductor chip; and
    arranging a thermally conductive material in the opening such that the thermally conductive material extends laterally at least partially over the top surface of the packaging material, wherein the thermally conductive material is configured to transfer heat from the semiconductor chip to an outside,
    wherein the thermally conductive material is an electrically isolating thermally conductive material,
    wherein the thermally conductive material is arranged in direct physical contact with the electrical contact structure.

11. The method of claim 10, wherein the arranging of the thermally conductive material in the opening comprises filling the opening with the thermally conductive material in a viscous state until the thermally conductive material flows over the top surface of the packaging material.

12. The method of claim 10, further comprising:
    curing the thermally conductive material.

13. The method of claim 10, wherein the thermally conductive material covers the top surface only partially.

14. The method of claim 10, wherein the thermally conductive material completely covers the top surface.

15. The method of claim 10, wherein the thermally conductive material is arranged in direct physical contact with the semiconductor chip.

16. The method of claim 10, wherein contacting the semiconductor chip with the electrical contact structure comprises mounting a clip on the semiconductor chip.

17. A method of forming a semiconductor arrangement, the method comprising:
    forming at least one chip package by arranging a packaging material at least partially around a semiconductor chip, the packaging material having an opening extending from a top surface of the packaging material to the semiconductor chip and/or to an electrical contact structure contacting the semiconductor chip, and arranging a thermally conductive material in the opening such that the thermally conductive material extends laterally at least partially over the top surface of the packaging material, wherein the thermally conductive material is configured to transfer heat from the semiconductor chip to an outside, wherein the thermally conductive material is an electrically isolating thermally conductive material, wherein the thermally conductive material is arranged in direct physical contact with the electrical contact structure; and
    attaching at least one cooling structure to the thermally conductive material.

18. The method of claim 17, wherein the at least one chip package comprises a plurality of chip packages, and wherein the at least one cooling structure is attached to the respective thermally conductive material of at least two of the plurality of chip packages.

* * * * *